(12) United States Patent
Song et al.

(10) Patent No.: US 9,378,803 B2
(45) Date of Patent: Jun. 28, 2016

(54) SYSTEM AND METHOD TO REGULATE OPERATING VOLTAGE OF A MEMORY ARRAY

(71) Applicant: QUALCOMM Incorporated, San Diego, CA (US)

(72) Inventors: Stanley Seungchul Song, San Diego, CA (US); Zhongze Wang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 247 days.

(21) Appl. No.: 13/842,263

(22) Filed: Mar. 15, 2013

(65) Prior Publication Data

US 2014/0269020 A1    Sep. 18, 2014

(51) Int. Cl.
| | |
|---|---|
| G06F 17/50 | (2006.01) |
| G11C 11/4074 | (2006.01) |
| G11C 5/14 | (2006.01) |
| G11C 7/04 | (2006.01) |
| G11C 11/413 | (2006.01) |
| G11C 11/417 | (2006.01) |

(52) U.S. Cl.
CPC ........ *G11C 11/4074* (2013.01); *G06F 17/5072* (2013.01); *G11C 5/147* (2013.01); *G11C 7/04* (2013.01); *G11C 11/413* (2013.01); *G11C 11/417* (2013.01)

(58) Field of Classification Search
CPC .................................. G06F 17/30; G06F 17/50
USPC ......................................................... 716/136
See application file for complete search history.

(56) References Cited

U.S. PATENT DOCUMENTS

| | | | |
|---|---|---|---|
| 6,933,869 B1 | 8/2005 | Starr et al. | |
| 7,941,675 B2 | 5/2011 | Burr et al. | |
| 8,161,431 B2 | 4/2012 | Buonpane et al. | |
| 8,593,203 B2 | 11/2013 | Shankar et al. | |
| 2005/0201188 A1* | 9/2005 | Donze et al. | 365/232 |
| 2007/0147159 A1 | 6/2007 | Lee | |
| 2009/0168573 A1 | 7/2009 | Zhang et al. | |
| 2011/0050196 A1* | 3/2011 | Fuse et al. | 323/312 |
| 2011/0080202 A1* | 4/2011 | Moore et al. | 327/276 |
| 2011/0234300 A1 | 9/2011 | Zhang et al. | |
| 2012/0119825 A1* | 5/2012 | Zhai et al. | 327/543 |
| 2012/0206183 A1* | 8/2012 | Priel et al. | 327/291 |

OTHER PUBLICATIONS

International Search Report and Written Opinion for International Application No. PCT/US2014/023381, ISA/EPO, Date of Mailing Sep. 17, 2014, 16 pages.
Partial International Search Report for International Application No. PCT/US2014/023381, ISA/EPO, Date of Mailing Jul. 10, 2014, 6 pages.

(Continued)

*Primary Examiner* — Mohammed Alam
(74) *Attorney, Agent, or Firm* — Toler Law Group, PC

(57) ABSTRACT

A method includes measuring a temperature of a sensor associated with a memory array. The method also includes calculating, at a voltage regulating device, an operating voltage based on the temperature and based on fabrication data associated with the memory array. The method further includes regulating, at the voltage regulating device, a voltage provided to the memory array based on the operating voltage.

31 Claims, 5 Drawing Sheets

(56) References Cited

OTHER PUBLICATIONS

Kaczer, B. et al., "Temperature Dependence of the Negative Bias Temperature Instability in the Framework of Dispersive Transport," Applied Physics Letters 86, 143506, 2005 American Institute of Physics, 3 pages.

Chabukswar S., et al., "Implications of fin width scaling on Variability and Reliability of high-k Metal Gate FinFETs," Microelectronic Engineering, Elsevier, Oct. 2010, vol. 87 Issue 10, pp. 1963-1967.

Choi Y-K., et al., "Reliability Issues in Multi-Gate FinFETs," 8th International Conference on Solid-State and Integrated Circuit Technology, ICSICT '06, IEEE, 2006, 4 Pages.

Kim J J., et al., "Process-Dependent N/PBTI Characteristics of TiN Gate FinFETs," IEEE Electron Device Letters, Jul. 2012, vol. 33 No. 7, pp. 937-939.

Kim S-Y., "Negative Bias Temperature Instability(NBTI) of Bulk FinFETs," 43d Annual International Reliability Physics Symposium, San Jose, 2005, pp. 538-540.

Lee D H., et al., "A Guideline for the Optimum Fin Width Considering Hot-Carrier and NBTI Degradation in MuGFETs," IEEE Electron Device Letters, Sep. 2011, vol. 32 No. 9, pp. 1176-1178.

Lee H., et al., "A Study of Negative-Bias Temperature Instability of SOI and Body-Tied FinFETs," IEEE Electron Device Letters, May 2005, vol. 26, No. 5, pp. 326-328.

Lee H., et al., "Dynamic Negative Bias Temperature Instability and Comprehensive Modeling in PMOS Body-Tied FinFETs," 44th Annual International Reliability, Physics Symposium, 2006, pp. 725-726.

Liao W-S., et al., "PMOS Hole Mobility Enhancement Through SiGe Conductive Channel and Highly Compressive ILD-SiNx Stressing Layer," IEEE Electron Device Letters, Jan. 2008, vol. 29, No. 1, pp. 86-88.

Nathanael R., et al., "Impact of Gate-Induced Strain on MuGFET Reliability," IEEE Electron Device Letters, Aug. 2008, vol. 29, No. 8, pp. 916-919.

Young C D., et al., "(1 1 0) and (1 0 0) Sidewall-oriented FinFETs: A performance and reliability investigation," Solid-State Electronics, Elsevier, Dec. 2012, vol. 78, pp. 2-10.

* cited by examiner

SYSTEM AND METHOD TO REGULATE OPERATING VOLTAGE OF A MEMORY ARRAY

I. FIELD

The present disclosure is generally related to memory array.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

An electronic device (e.g., a wireless device or a computing device) may be implemented using metal-oxide semiconductor field-effect transistors (MOSFETs). An operation (e.g., turning on or turning off) of a MOSFET is dependent on an operating voltage of the MOSFET. The p-channel of the MOSFET degrades over time and an operating temperature of the MOSFET increases, leading to an increase in the operating voltage. The increase in operating voltage due to the p-channel degradation is referred to as negative bias temperature instability (NBTI). When a static random access memory (SRAM) array is implemented using a MOSFET, the NBTI affects a read operation of the SRAM array (e.g., an operating voltage of the SRAM may not be high enough to turn on the MOSFET due to the NBTI). To compensate for the NBTI, a voltage source may supply an operating voltage at an increased level that is adjusted to compensate for an estimated value of the NBTI. The estimated value of the NBTI represents an estimation of the NBTI for the life of the SRAM array. However, supplying an operating voltage at an increased level limits scaling of the operating voltage. Further, because actual values of the NBTI of each memory device typically vary, estimating a single value of the NBTI to be used to increase the supply voltage for every memory device may not accurately compensate for the actual NBTI (or may overcompensate for the NBTI, resulting in increased power consumption).

III. SUMMARY

An operating voltage of a memory device (e.g., a memory array) may increase due to effects of negative bias temperature instability (NBTI) of the memory device. Estimating a single value of the NBTI to be used to adjust individual operating voltages for every memory device may not accurately compensate for the actual NBTI of each memory device. For example, overcompensation for the NBTI leads to increased power consumption. The single estimated value is estimated for the life of the memory device based on a worst case scenario of the NBTI. Thus, the single estimated value is typically higher than needed. Systems and methods described herein may advantageously enable a voltage regulating device to regulate an operating voltage of a memory array based on an NBTI value that is specific to the memory array. Using the NBTI value that is specific to the memory array as a basis for operating voltage adjustments may reduce power consumption as compared to using a single estimated NBTI value.

For example, a voltage regulating device may determine a target operating voltage of a memory array based on a measured temperature of the memory device and based on fabrication data associated with the memory device. Based on the target operating voltage, the voltage regulating device may regulate a voltage that is provided to the memory array. In a particular embodiment, the voltage regulating device may adjust the voltage periodically (e.g., once a year) based, at least in part, on an updated measured temperature of the memory array. In another particular embodiment, the voltage regulating device may regulate the supply voltage a single time (e.g., during a device initialization procedure).

The measured temperature may be provided by a temperature sensor that is located on the same semiconductor device (e.g., the same semiconductor die) as the memory array. The fabrication data may characterize a switching capability of an element (e.g., a threshold voltage parameter of a transistor) of the memory array. For example, the fabrication data may include or represent information related to an NBTI model. The NBTI model may be used to calculate a target operating voltage and/or a standby voltage of the memory array. Also, the NBTI model may be used to calculate an end of life (EOL) operating voltage shift based on a measured temperature of the memory array. The voltage regulating device may determine the target operating voltage based, at least in part, on the EOL operating voltage shift when the operating voltage is set. Thus, the voltage regulating device may accurately determine the operating voltage to compensate for the NBTI more based on a measured temperature and based on an NBTI model.

In a particular embodiment, a method comprises measuring a temperature of a sensor associated with a memory array. The method also comprises calculating, at a voltage regulating device, an operating voltage based on the temperature and based on fabrication data associated with the memory array. The method further comprises regulating, at the voltage regulating device, a voltage provided to the memory array based on the operating voltage.

In a particular embodiment, a semiconductor device comprises a memory array. The semiconductor device also comprises a sensor configured to measure a temperature of the memory array. The semiconductor device further comprises logic configured to set an operating voltage to be supplied to the memory array based on the temperature and based on fabrication data associated with the memory array.

One particular advantage provided by at least one of the disclosed embodiments is an ability to more accurately regulate an operating voltage of a memory array to compensate for an NBTI of the memory array. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 4:
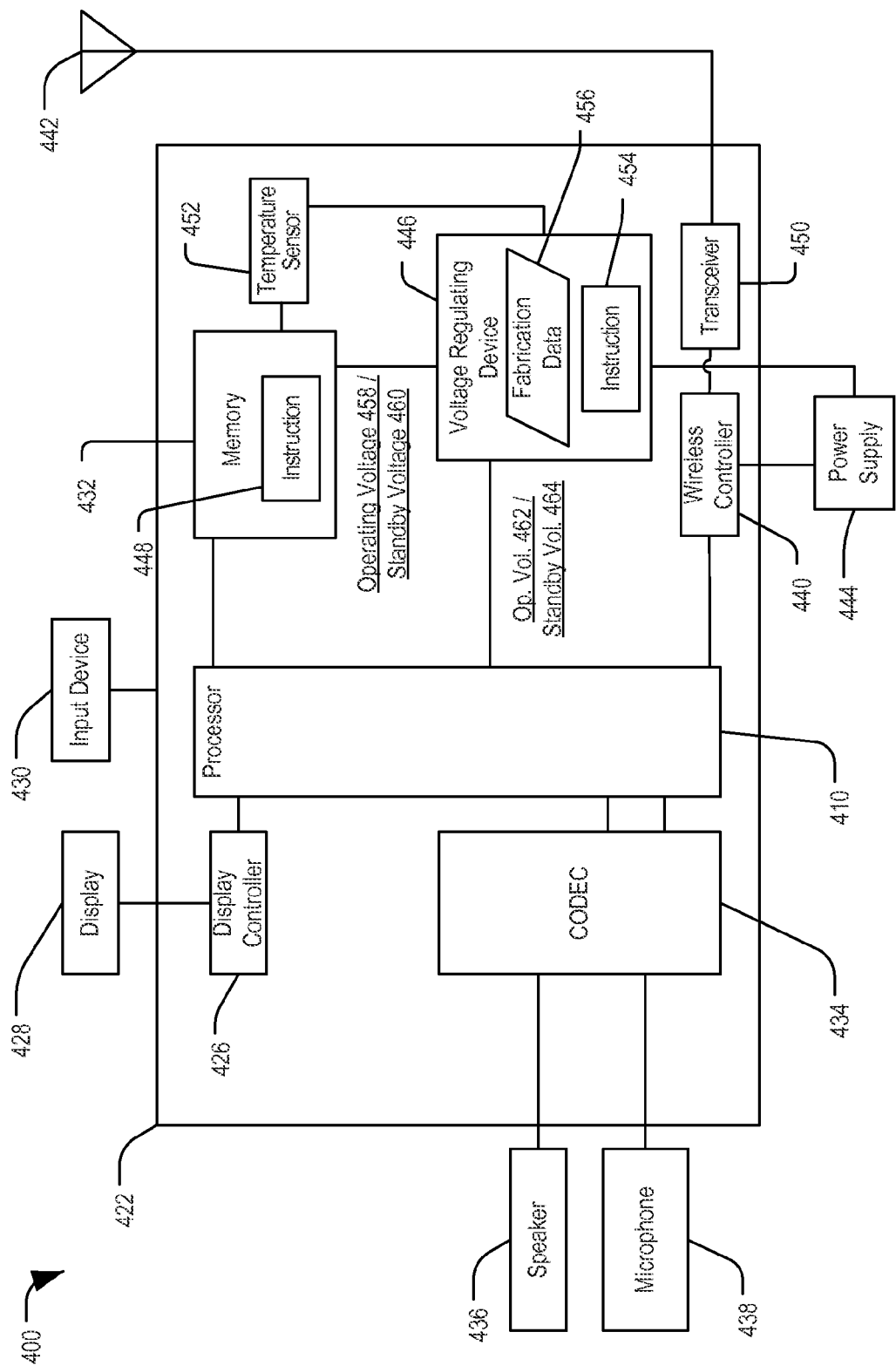
Figure 5:
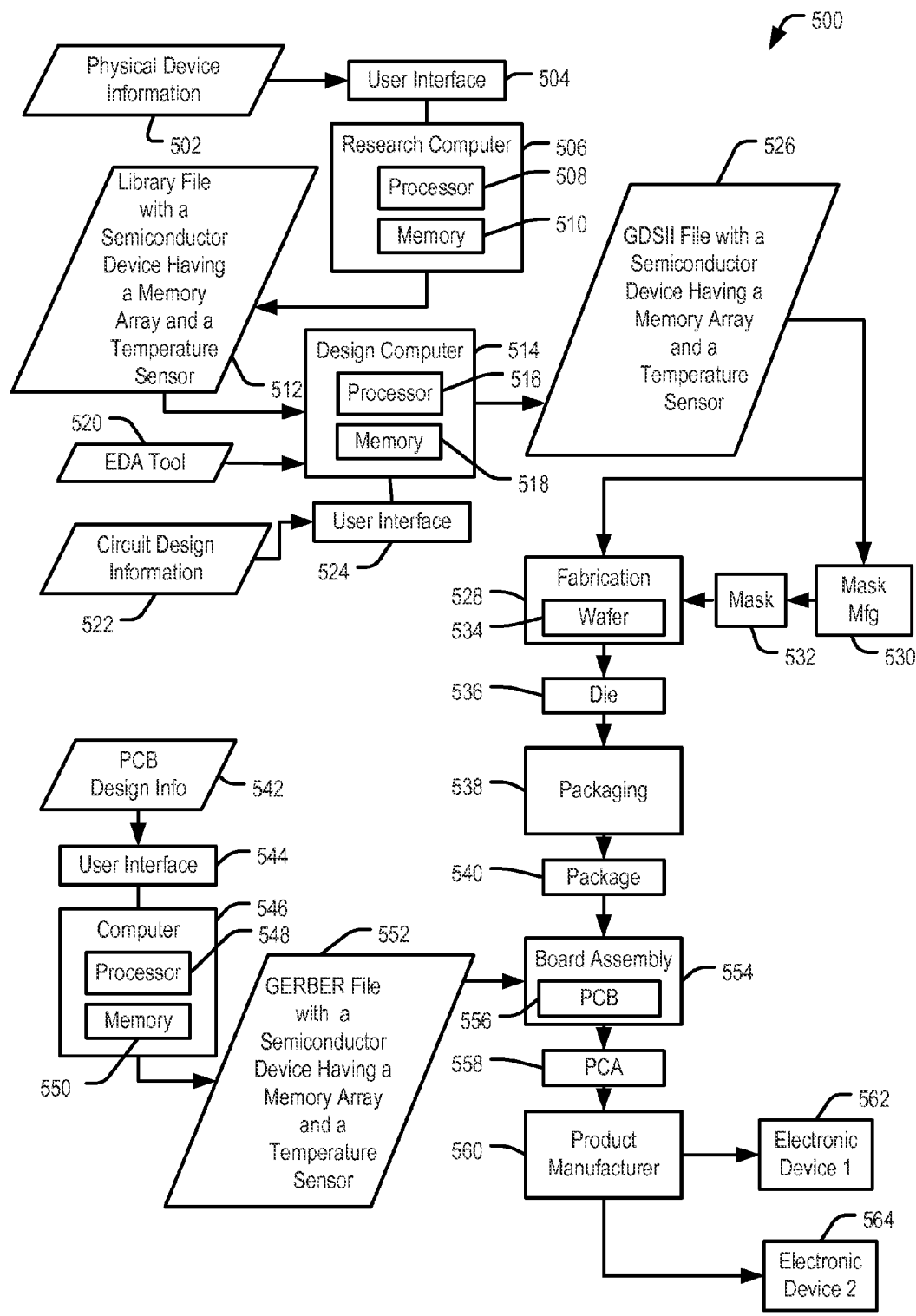

FIG. 4 is a diagram that illustrates a communication device that includes a voltage regulating device to regulate an operating voltage of a memory array based on a measured temperature of the memory array and based on fabrication data of the memory array; and FIG. 5 is a diagram that illustrates a particular embodiment of a process to manufacture an electronic device that include a voltage regulating device that is operable to regulate an operating voltage of a memory array based on a measured temperature of the memory array and based on fabrication data of the memory array.

V. DETAILED DESCRIPTION

Figure 1:
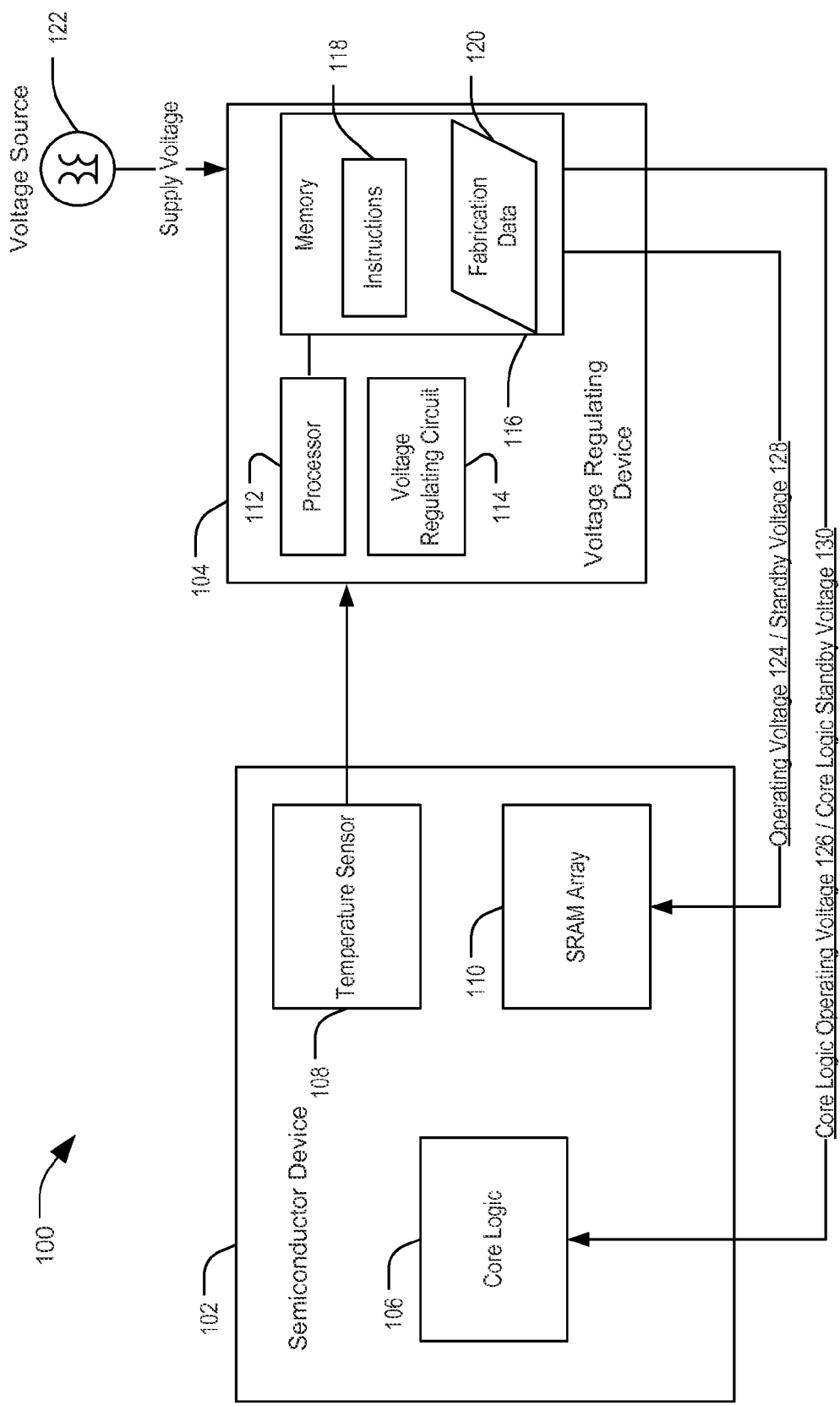
FIG. 1 illustrates a particular embodiment of a system that is operable to enable a voltage regulating device to regulate an operating voltage of a memory array based on a measured temperature of the memory array and based on fabrication data of the memory array.

FIG. 1 illustrates a particular embodiment of a system 100 that is operable to enable a voltage regulating device to regulate an operating voltage of a memory array based on a measured temperature of the memory array and based on fabrication data of the memory array. The system 100 includes a semiconductor device 102 and a voltage regulating device 104. The semiconductor device 102 may include core logic 106, a temperature sensor 108, and a static random access memory (SRAM) array 110.

The core logic 106 may be configured to perform logic operations (e.g., calculations). For example, the core logic 106 may include a processor. In a particular embodiment, the core logic 106 may be implemented, at least in part, using transistors. The SRAM array 110 may be configured to be accessed by the core logic 106 to store and/or retrieve data. In a particular embodiment, the SRAM array 110 may be implemented using fin field effect transistors (FinFETs). The voltage regulating device 104 may be configured to regulate a supply voltage and to provide the regulated supply voltage to the semiconductor device 102. For example, the voltage regulating device 104 may include or may be a component of a power management integrated circuit (PMIC). The voltage regulating device 104 may include a processor 112, a voltage regulating circuit 114, and a memory 116. The memory 116 may include instructions 118 that are executable by the processor 112 and may include fabrication data 120 that is associated with fabrication of the SRAM array 110. The voltage regulating device 104 may be embedded in the semiconductor device 102, or the voltage regulating device 104 may be embedded in a semiconductor device (e.g., the PMIC) that is separate from the semiconductor device 102. The voltage regulating circuit 114 may include circuitry or logic that is configured to set a voltage to be supplied to the SRAM 110.

During operation, the voltage regulating device 104 may provide separate voltages to power the core logic 106 and the SRAM array 110. For example, when the semiconductor device 102 is operating in an active mode, the voltage regulating device 104 may provide an operating voltage 124 to the SRAM array 110 and a core logic operating voltage 126 to the core logic 106. The SRAM array 110 may be powered by the operating voltage 124, and the core logic 106 may be powered by the core logic operating voltage 126 during the active mode. When the semiconductor device 102 is operating in a standby mode, the voltage regulating device 104 may provide a standby voltage 128 to the SRAM array 110 and a core logic standby voltage 130 to the core logic 106. The SRAM array 110 may be powered by the standby voltage 128, and the core logic 106 may be powered by the core logic standby voltage 130 during the standby mode. The operating voltage 124 may be different than the core logic operating voltage 126, and the standby voltage 128 may be different than the core logic standby voltage 130. Because components (e.g., transistors) of the SRAM array 110 may be under stress for a greater time duration than components (e.g., transistors) of the core logic 106, the SRAM array 110 (e.g., the operating voltage 124 or the standby voltage 128) may experience a different NBTI than the core logic 116 (e.g., the core logic operating voltage 126 or the core logic standby voltage 130). Thus, by providing separate voltages to the SRAM array 110 and to the core logic 106, the voltage regulating device 104 may compensate for NBTI differently for the SRAM array 110 and for the core logic 106.

Further, the voltage regulating device 104 may calculate the core logic operating voltage 126 and/or the core logic standby voltage 130 based on a performance parameter associated with the core logic 106. For example, the performance parameter may be a clock speed of the core logic 106. The voltage regulating device 104 may provide the core logic operating voltage 126 and/or the core logic standby voltage 130 to the core logic 106.

The temperature sensor 108 may be located near (i.e., in close proximity to) the SRAM array 110. The temperature sensor 108 may measure an operating temperature (in active mode) and/or a standby temperature (in standby mode) of the SRAM array 110. For example, the temperature sensor 108 may sense a temperature of a region of the semiconductor device 102 on which the SRAM array 110 is located. The temperature of the region may correspond to an operating temperature and/or the standby temperature of the SRAM array 110. The voltage regulating device 104 may receive the measured operating temperature and/or the measured standby temperature of the SRAM array 110 from the temperature sensor 108. The voltage regulating device 104 may calculate a target operating voltage based on the measured operating temperature and based on the fabrication data 120. Further, the voltage regulating device 104 may calculate a target standby voltage based on the measured standby temperature and the fabrication data 120.

The fabrication data 120 includes data that characterizes a switching capability of an element (e.g., a MOSFET) of the SRAM array 110. For example, the switching capability of the element may correspond to a threshold voltage parameter of a MOSFET. In a particular embodiment, the fabrication data 120 includes information regarding a NBTI model of the SRAM array 110. The voltage regulating device 104 may use the NBTI model to calculate a target operating voltage and/or a target standby voltage via the processor 112. The voltage regulating device 104 may also use the NBTI model to calculate an end-of-life (EOL) operating voltage shift value and/or an EOL standby voltage shift value via the processor 112. The NBTI model takes into account the measured operating temperature. For example, the NBTI model includes the measured operating temperature as a variable in an equation that calculates the target operating voltage and/or the target standby voltage. As another example, the NBTI model may include the measured operating temperature as a variable in an equation that calculates the EOL operating voltage shift value and/or the EOL standby voltage shift value.

In a particular embodiment, the NBTI model may be calculated by determining $\Delta Vt=At^b$, where $\Delta Vt$ is a change in the operating voltage 124 or the standby voltage 128. At is described by $\ln(A)=\ln(v)+c$, $v \cong 0.5 \times 10^3$ s$^{-1}$, where c is a fitting parameter and s is time. The value b is defined by $b=k_B \times T/4E_0$, where $k_B$ is the Boltzmann constant, T is a measured temperature of the SRAM array 110, and $E_0$ is activation energy.

The voltage regulating device 104 may set the operating voltage 124 based on the target operating voltage. The voltage regulating device 104 may include the voltage regulating circuit 114 that provides the operating voltage 124 to the SRAM array 110. The voltage regulating device 104 may set the standby voltage based on the target standby voltage. The voltage regulating device 104 may provide the standby voltage 128 to the SRAM array 110. For example, the voltage regulating circuit 114 may receive a supply voltage and may modify (e.g., reduce) the supply voltage using variable resistors, transistors, or any combination thereof to generate the operating voltage 124, the standby voltage 128, or any combination thereof.

In a particular embodiment, the operating voltage and/or the standby voltage may be adjusted by the voltage regulating device 104 periodically (e.g., once a year). The voltage regulating device 104 may update the target operating voltage and/or the target standby voltage periodically based on changes in the operating temperature and/or changes in the standby temperature as measured via the temperature sensor 108. The voltage regulating device 104 may update the operating voltage based on the updated target operating voltage and may update the standby voltage based on changes to the measured temperature.

In another particular embodiment, the voltage regulating device 104 calculates an initial target operating voltage and the EOL operating voltage shift value based on the measured operating temperature. The voltage regulating device 104 also calculates an initial target standby temperature and the EOL standby voltage shift value based on the measured standby temperature. The voltage regulating device 104 may calculate the target operating voltage based on the initial target array operating voltage and based on the EOL operating voltage shift value.

When the operating voltage 124 is set a single time, the target operating voltage may be a sum of the initial target operating voltage, the EOL operating voltage shift value, and an operating voltage margin. Accordingly, the voltage regulating device 104 may regulate the supply voltage based on the target operating voltage and provide (e.g., set) the operating voltage 124 without further adjustment over the life of the semiconductor device 102 (e.g., the operating voltage 124 is not further adjusted during operation of the semiconductor device 102). When the operating voltage 124 is adjusted periodically, the target operating voltage may be a sum of the target operating voltage and the operating voltage margin. The operating voltage margin may enable the operating voltage to be set at a level that accounts for temporary or unanticipated voltage increases during the active mode.

In a similar manner, the voltage regulating device 104 may set the standby voltage 128 based on the target standby voltage. The voltage regulating device 104 may calculate the target standby voltage based on the initial target standby voltage and based on the EOL standby voltage shift value. When the standby voltage 128 is set a single time, the target standby voltage is a sum of the initial target standby voltage, the EOL standby voltage shift value, and a standby voltage margin. Accordingly, the voltage regulating device 104 may regulate the supply voltage based on the target standby voltage and provide the standby voltage 128 without further adjustment over the life of the semiconductor device 102. When the standby voltage 128 is adjusted periodically, the target standby voltage is a sum of the initial target standby voltage and the standby voltage margin. The standby voltage margin may enable the standby voltage 128 to be set at a level that accounts for temporary or unanticipated voltage increases during the standby mode.

Although a representative semiconductor device 102 is described in FIG. 1, it should be understood that the system 100 may include a plurality of semiconductor devices (e.g., a plurality of semiconductor dies) and a plurality of corresponding voltage regulating devices. Each semiconductor device may include a corresponding SRAM array and a corresponding temperature sensor. An operating voltage and/or a standby voltage of each semiconductor device is regulated independently (e.g., an operating voltage and/or a standby voltage of a particular semiconductor device is regulated based on a measured temperature of a memory array of the particular semiconductor device and based on fabrication data associated with the particular semiconductor device).

The system 100 may thus enable a voltage regulating device (e.g., the voltage regulating device 104) to regulate a voltage (e.g., the operating voltage 124 or the standby voltage 128) of a memory array (e.g., the SRAM array 110) based on an NBTI value that is specific to the memory array and that is based on a measured temperature of the memory array. Using the NBTI value that is specific to the memory array as a basis for operating voltage adjustments may reduce power consumption as compared to using a universal estimated NBTI value.

Figure 2:
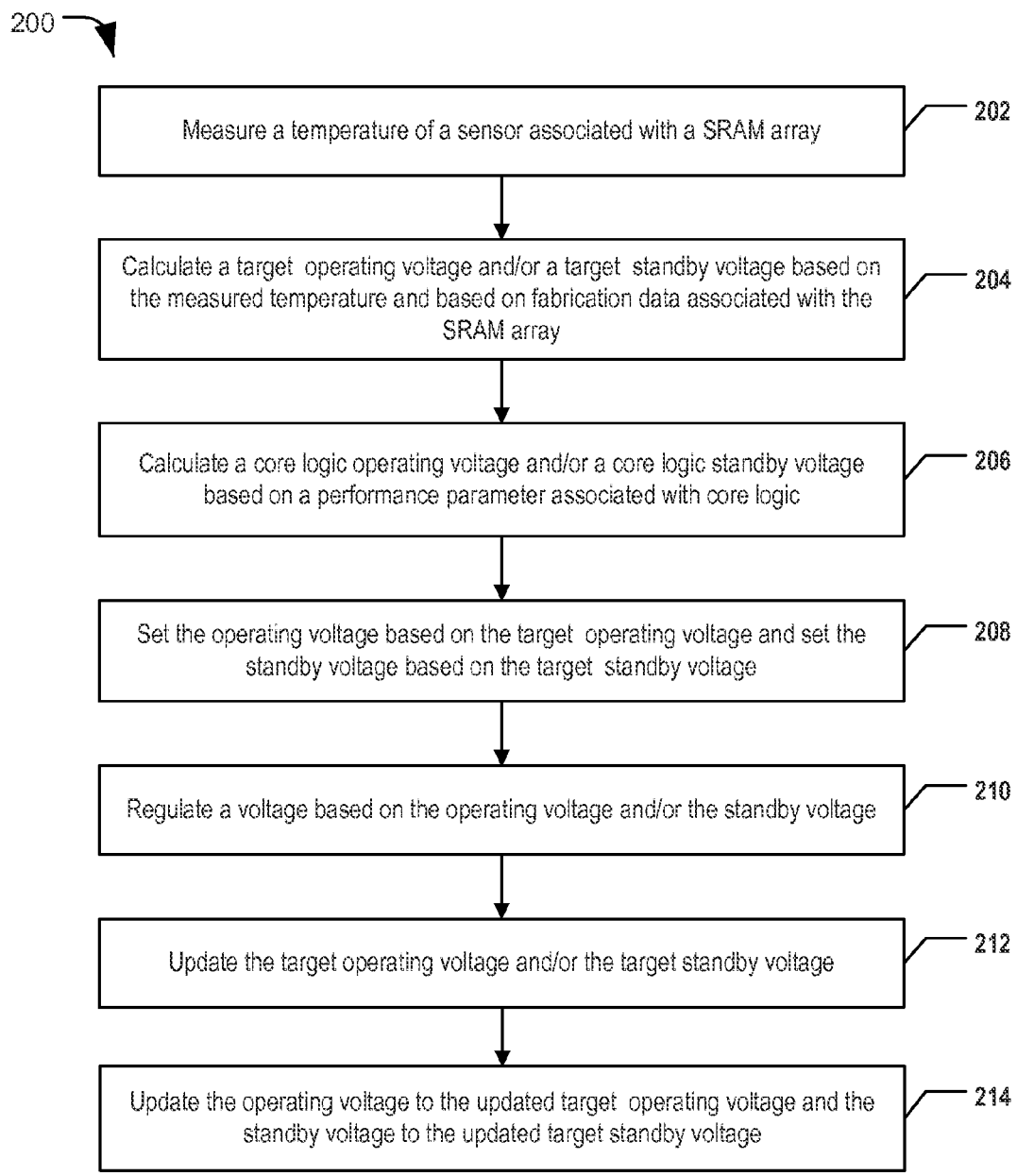
FIG. 2 is a flowchart that illustrates a particular embodiment of a method of regulating an operating voltage of a memory array based on a measured temperature of the memory array and based on fabrication data of the memory array.

FIG. 2 is a flowchart that illustrates a particular embodiment of a method 200 of regulating an operating voltage of a memory array based on a measured temperature of the memory array and based on fabrication data of the memory array. The method 200 includes measuring a temperature of a sensor associated with a SRAM array, at 202. For example, referring to FIG. 1, the voltage regulating device 104 may receive the measured operating temperature and/or the measured standby temperature of the SRAM array 110 from the temperature sensor 108. The temperature sensor 108 may be located in close proximity to the SRAM array 110. The method 200 also includes calculating a target operating voltage and/or a target standby voltage based on the measured temperature and based on fabrication data associated with the SRAM array, at 204. For example, referring to FIG. 1, the voltage regulating device 104 may calculate a target operating voltage based on the operating temperature and the fabrication data 120. The voltage regulating device 104 may calculate a target standby voltage based on the standby temperature and the fabrication data 120. The fabrication data 120 includes data that characterizes a switching capability of an element (e.g., a MOSFET) of the SRAM array 110. In a particular embodiment, the fabrication data 120 includes information related to a NBTI model of the SRAM array 110. The voltage regulating device 104 may use the NBTI model to calculate an end-of-life (EOL) operating voltage shift value and/or an EOL standby voltage shift value via the processor 112. The NBTI model takes into account the measured operating temperature. For example, the NBTI model includes the measured operating temperature as a variable in an equation that calculates the target operating voltage and/or the target standby voltage. As another example, the NBTI model includes the measured operating temperature as a variable in an equation that calculates the EOL operating voltage shift value and/or the EOL standby voltage shift value.

The method 200 further includes calculating a core logic operating voltage and/or a core logic standby voltage based on a performance parameter associated with core logic, at 206. For example, referring to FIG. 1, the voltage regulating device 104 may regulate the core logic operating voltage 126 and/or the core logic standby voltage 130 based on a performance parameter associated with the core logic 106.

The method 200 further includes setting the operating voltage based on the target operating voltage and setting the standby voltage based on the target standby voltage, at 208. For example, referring to FIG. 1, the voltage regulating circuit 114 may set the operating voltage to the target operating voltage and the voltage regulating device 104 may set the standby voltage to the target standby voltage.

The method 200 further includes regulating a voltage based on the operating voltage and/or the standby voltage, at 210. For example, referring to FIG. 1, the voltage regulating device 104 may regulate a supply voltage and provide the operating voltage to the SRAM array 110 via the voltage regulating circuit 114. The voltage regulating device 104 may regulate the supply voltage and provide the standby voltage to the SRAM array 110. The method 200 further includes updating the target operating voltage and/or the target standby voltage, at 212. For example, referring to FIG. 1, the voltage regulating device 104 may update the target operating voltage and/or the target standby voltage periodically, such as once per year, based on measurements of the operating temperature and/or the standby temperature.

The method 200 further includes updating the operating voltage to the updated target operating voltage and the standby voltage to the updated target voltage, at 214. For example, referring to FIG. 1, the voltage regulating device 104 may update the operating voltage and/or the standby voltage periodically based on changes in the operating temperature and/or changes in the standby temperature as measured via the temperature sensor 108.

Thus, the method 200 may enable a voltage regulating device to regulate an operating voltage of a memory array based on a measured temperature of the memory array and based on fabrication data (e.g., data representing an NBTI model) of the memory array.

Figure 3:
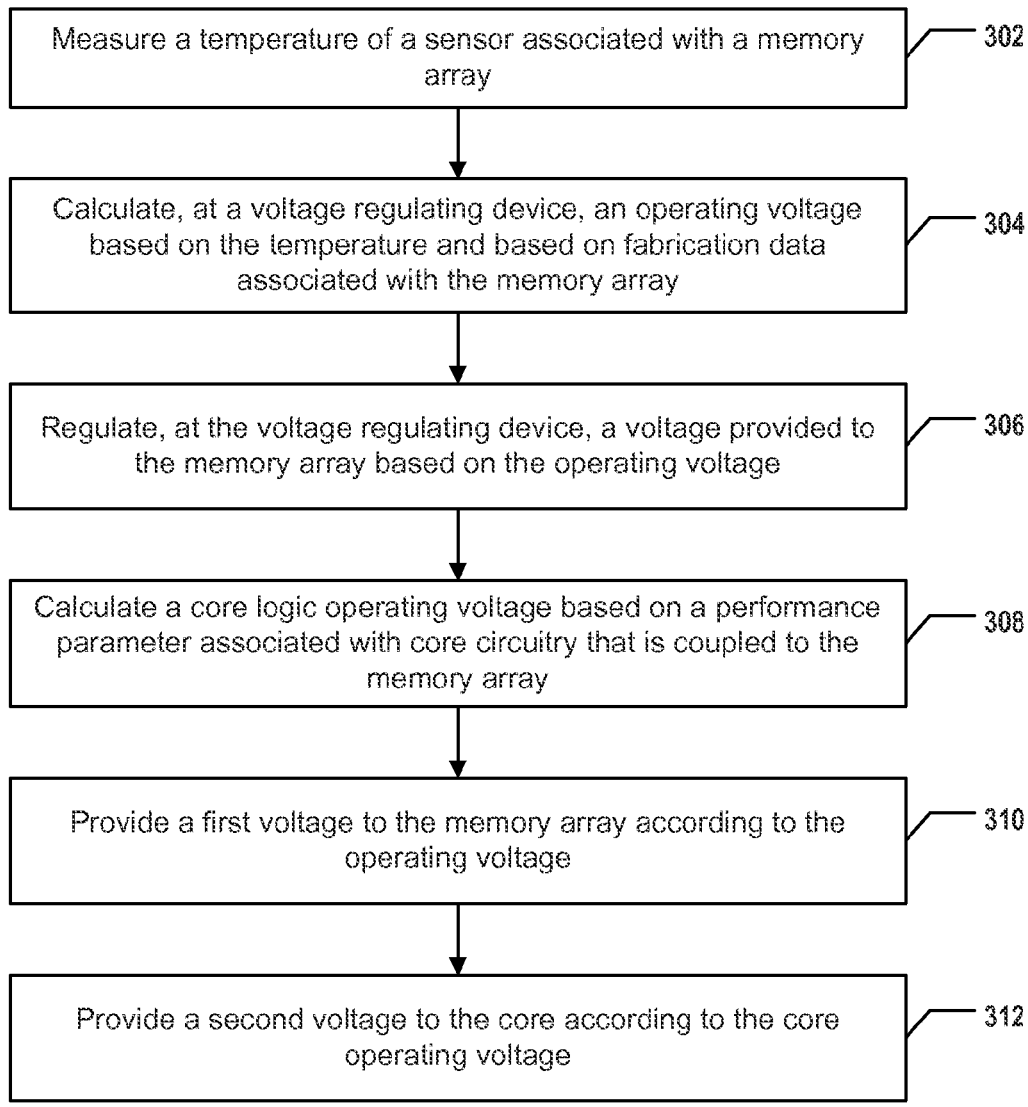
FIG. 3 is a flowchart that illustrates another particular embodiment of a method of regulating an operating voltage of a memory array based on a measured temperature of the memory array and based on fabrication data of the memory array.

FIG. 3 is a flowchart that illustrates another particular embodiment of a method 300 of regulating an operating voltage of a memory array based on a measured temperature of the memory array and based on fabrication data of the memory array. The method 300 includes measuring a temperature of a sensor associated with a memory array, at 302. For example, referring to FIG. 1, the voltage regulating device 104 may receive the measured operating temperature and/or the measured standby temperature of the SRAM array 110 from the temperature sensor 108. The method 300 also includes calculating, at a voltage regulating device, an operating voltage based on the measured temperature and based on fabrication data associated with the memory array, at 304. For example, referring to FIG. 1, the voltage regulating device 104 may calculate a target operating voltage based on the measured operating temperature and the fabrication data 120.

The fabrication data 120 includes data that characterizes a switching capability of an element (e.g., a MOSFET) of the SRAM array 110. In a particular embodiment, the fabrication data 120 includes information regarding a NBTI model of the SRAM array 110. The voltage regulating device 104 may use the NBTI model to calculate an end-of-life (EOL) operating voltage shift value and/or an EOL standby voltage shift value via the processor 112. The NBTI model takes into account the measured operating temperature. For example, the NBTI model includes the measured operating temperature as a variable in an equation that calculates the target operating voltage and/or the target standby voltage. As another example, the NBTI model includes the measured operating temperature as a variable in an equation that calculates the EOL operating voltage shift value and/or the EOL standby voltage shift value.

The method 300 further includes regulating, at the voltage regulating device, a voltage provided to the memory array based on the operating voltage, at 306. For example, referring to FIG. 1, the voltage regulating device 104 may regulate the supply voltage based on the target operating voltage and to provide the regulated operating voltage to the SRAM array 110. In a particular embodiment, the method 300 further includes calculating a core logic operating voltage based on a performance parameter associated with core logic that is coupled to the memory array, at 308. For example, referring to FIG. 1, the voltage regulating device 104 may calculate a core logic operating voltage 126 and/or a core logic standby voltage 130 based on a performance parameter associated with the core logic 106. For example, the performance parameter may be a clock speed of the core logic 106.

In a particular embodiment, the method 300 further includes providing a first voltage to the memory array according to the operating voltage, at 310. For example, referring to FIG. 1, the voltage regulating device 104 may provide the operating voltage 124 and/or the standby voltage 128 to the SRAM array 110. In a particular embodiment, the method 300 further includes providing a second voltage to the core according to the core logic operating voltage, at 312. For example, referring to FIG. 1, the voltage regulating device 104 may provide the core logic operating voltage 126 and/or the core logic standby voltage 130 to the core logic 106. Thus, the method 300 may enable a voltage regulating device to regulate an operating voltage of a memory array based on a measured temperature of the memory array and based on fabrication data (e.g., an NBTI model) of the memory array.

FIG. 4 is a diagram that illustrates a communication device 400 that includes a voltage regulating device to regulate an operating voltage of a memory array based on a measured temperature of the memory array and based on fabrication data of the memory array. In one embodiment, the communication device 400, or components thereof, includes the semiconductor device 102 of FIG. 1. Further, the methods described in FIGS. 2-3, or certain portions thereof, may be performed at or by the communication device 400, or components thereof.

The communication device 400 includes a processor 410, such as a digital signal processor (DSP), coupled to a memory 432. The memory 432 may be a non-transitory tangible computer-readable and/or processor-readable storage device that stores instructions 448. The instructions 448 may be executable by the processor 410 to perform one or more functions.

The communication device 400 may also include a temperature sensor 452 coupled to the memory 432. The temperature sensor 452, such as the temperature sensor 108 of FIG. 1, may be configured to measure a temperature of the memory 432. The communication device 400 may further include a voltage regulating device 446 coupled to the memory 432. The voltage regulating device 446 may be configured to regulate a supply voltage (e.g., a supply voltage from a power supply 444) and to provide an operating voltage 458 (e.g., the operating voltage 124 of FIG. 1) and/or a standby voltage 460 (e.g., the standby voltage 128) to the memory 432. The voltage regulating device 446 may also be configured to provide a core logic operating voltage 462 (e.g., the core logic operating voltage 126) and/or a core standby operating voltage 464 (e.g., the core logic standby voltage 130) to the processor 410.

The operating voltage 458 and/or the standby voltage 460 may be calculated based on a measured temperature of the memory 432 and based on the fabrication data 456. The voltage regulating device 446 may receive the measured temperature from the temperature sensor 452. The fabrication data 456 may characterize a switching capability of an element of the memory 432, such as the fabrication data 120 of FIG. 1. For example, the fabrication data 456 may include an NBTI model that takes into account the measured temperature (e.g., the NBTI model uses the measured temperature as a variable in an equation) to calculate the operating voltage 458 and/or the standby voltage 460. The voltage regulating device 446 may calculate the core logic operating voltage 462 and/or the core logic standby voltage 464 based on a performance parameter of the processor 410. For example, the performance parameter may be a clock speed of the processor 410.

The voltage regulating device 446 may include instructions 454. The instructions 454 may be stored in a memory (not shown) of the voltage regulating device 446. The instructions 454 may be executed by a processor (not shown) of the voltage regulating device 446 to perform one or more functions or methods described herein, such as the method described with reference to FIGS. 2-3.

FIG. 4 shows that the communication device 400 may also include a display controller 426 that is coupled to the processor 410 and to a display device 428. A coder/decoder (CODEC) 434 can also be coupled to the processor 410. A speaker 436 and a microphone 438 can be coupled to the CODEC 434. FIG. 4 also indicates that a wireless controller 440 may be coupled to the processor 410, where the wireless controller 440 is in communication with an antenna 442 via a transceiver 450. The wireless controller 440, the transceiver 450, and the antenna 442 may represent a wireless interface that enables wireless communication by the communication device 400. The communication device 400 may include numerous wireless interfaces, where different wireless networks are configured to support different networking technologies or combinations of networking technologies (e.g. Bluetooth low energy, Near-field communication, WiFi, cellular, etc.).

In a particular embodiment, the processor 410, the display controller 426, the memory 432, the CODEC 434, the wireless controller 440, and the transceiver 450 are included in a system-in-package or system-on-chip device 422. In a particular embodiment, an input device 430 and the power supply 444 are coupled to the system-on-chip device 422. Moreover, in a particular embodiment, as illustrated in FIG. 6, the display device 428, the input device 430, the speaker 436, the microphone 438, the antenna 442, and the power supply 444 are external to the system-on-chip device 422. However, each of the display device 428, the input device 430, the speaker 436, the microphone 438, the antenna 442, and the power supply 444 can be coupled to a component of the system-on-chip device 422, such as an interface or a controller.

In conjunction with the described embodiments, an apparatus may include means for measuring a temperature of a sensor that is associated with a memory array. For example, the means for measuring may include one or more components (e.g., a temperature sensor) of the semiconductor device 102 of FIG. 1, the temperature sensor 108, the temperature sensor 452 of FIG. 4, one or more devices configured to measure temperature, or any combination thereof. The apparatus may also include means for calculating an operating voltage based on the temperature and based on fabrication data associated with the memory array. For example, the means for calculating may include one or more components (e.g., a processor) of the semiconductor device 102, the processor 112, the voltage regulating circuit 114, the voltage regulating device 446 of FIG. 4, one or more devices configured to calculate an operating voltage, or any combination thereof. The apparatus may further include means for regulating a supply voltage based on the SRAM array operating voltage. For example, the means for regulating may include one or more components (e.g., a processor) of the semiconductor device 102, the voltage regulating circuit 114, the voltage regulating device 446, one or more components configured to regulate a supply voltage, or any combination thereof.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the semiconductor device 102, the voltage regulating device 104, the communication device 400, the voltage regulating device 446, or any combination thereof. For example, the physical device information 502 may include physical parameters, material characteristics, and structure information that is entered via a user interface 504 coupled to the research computer 506. The research computer 806 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the semiconductor device 102 of FIG. 1, the voltage regulating device 104, the voltage regulating device 446 of FIG. 4, or any combination thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the semiconductor device 102, the voltage regulating device 104, the communication device 400, the voltage regulating device 446, or any combination thereof of the library file 512. For example, a user of the design computer 514 may enter circuit design information 522 via a user interface 524 coupled to the design computer 514. The circuit design information 522 may include design information representing at least one physical property of a semiconductor device, such as the semiconductor device 102 of FIG. 1, the voltage regulating device 104, or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the semiconductor device 102 of FIG. 1, the voltage regulating device 104, or any combination thereof, in addition to other circuits or information. To illustrate, the data file may include information corresponding to a system-on-chip (SOC) that includes the semiconductor device 102, the voltage regulating device 104, the communication device 400, the voltage regulating device 446, and that also includes additional electronic circuits and components within the SOC.

The GDSII file 526 may be received at a fabrication process 528 to manufacture the semiconductor device 102 of FIG. 1, the voltage regulating device 104, or any combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including a device that includes the semiconductor device 102, the voltage regulating device 104, the communication device 400, the voltage regulating device 446, or any combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the semiconductor device 102, the voltage regulating device 104, the communication device 400, the voltage regulating device 446, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the semiconductor device 102 of FIG. 1, the voltage regulating device 104, or any combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer, into which the semiconductor device 102, the voltage regulating device 104, the communication device 400, the voltage regulating device 446, or any combination thereof is integrated. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 102, the voltage regulating device 104, the communication device 400, the voltage regulating device 446, or any combination thereof, may be fabricated, processed, and incorporated into an electronic device, as described in the illustrative process 500. One or more aspects of the embodiments disclosed with respect to FIG. 1 and FIG. 4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

One or more of the disclosed embodiments may be implemented in a system or an apparatus that includes a portable music player, a personal digital assistant (PDA), a mobile location data unit, a mobile phone, a cellular phone, a computer, a tablet, a portable digital video player, or a portable computer. Additionally, the system or the apparatus may include a communications device, a fixed location data unit, a set top box, an entertainment unit, a navigation device, a monitor, a computer monitor, a television, a tuner, a radio, a satellite radio, a music player, a digital music player, a video player, a digital video player, a digital video disc (DVD) player, a desktop computer, any other device that stores or retrieves data or computer instructions, or a combination thereof. As another illustrative, non-limiting example, the system or the apparatus may include remote units, such as global positioning system (GPS) enabled devices, navigation devices, fixed location data units such as meter reading equipment, or any other electronic device. Although one or more of FIGS. 1-5 illustrate systems, apparatuses, and/or methods according to the teachings of the disclosure, the disclosure is not limited to these illustrated systems, apparatuses, and/or methods. Embodiments of the disclosure may be employed in any device that includes circuitry.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps have been described above generally in terms of their functionality. Whether such functionality is implemented as hardware or processor executable instructions depends upon the particular application and design constraints imposed on the overall system. Additionally, the various operations of methods described above (e.g., any operation illustrated in FIGS. 2-3) may be performed by any suitable means capable of performing the operations, such as various hardware and/or software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more instructions or code on a computer-readable medium. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g. RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof.

What is claimed is:

1. A method comprising:
   measuring a temperature of a sensor associated with a memory array;
   calculating, at a voltage regulating device, a negative bias temperature instability (NBTI) value associated with the memory array based on an NBTI model using the temperature and using fabrication data associated with the memory array, wherein the NBTI value corresponds to an estimated change in threshold voltage due to p-channel degradation;
   determining, at the voltage regulating device, an operating voltage based on the calculated NBTI value; and
   regulating, at the voltage regulating device, a voltage provided to the memory array based on the operating voltage.

2. The method of claim 1, further comprising calculating a standby voltage based on the temperature and the fabrication data.

3. The method of claim 1, wherein the voltage regulating device is included in a power management integrated circuit.

4. The method of claim 1, wherein the voltage regulating device is embedded in an integrated circuit that includes the memory array.

5. The method of claim 1, wherein the memory array and the sensor are located within a same semiconductor die.

6. The method of claim 1, wherein the fabrication data includes information applicable to calculating an end-of-life (EOL) operating voltage shift.

7. The method of claim 1, wherein the fabrication data characterizes a switching capability of an element of the memory array.

8. The method of claim 1, wherein the fabrication data includes information related to the NBTI model.

9. The method of claim 1, further comprising calculating a core logic operating voltage based on a performance parameter associated with core logic, wherein the core logic is coupled to the memory array.

10. The method of claim 9, wherein regulating the voltage based on the operating voltage includes:
    providing a first voltage to the memory array, the first voltage corresponding to the operating voltage; and
    providing a second voltage to the core logic, the second voltage corresponding to the core logic operating voltage.

11. The method of claim 1, wherein the operating voltage is updated periodically.

12. The method of claim 1, wherein determining the operating voltage is performed at a processor integrated into an electronic device.

13. The method of claim 1, wherein the memory array is a static random access memory (SRAM) array.

14. An apparatus comprising:
    a memory array;
    a sensor configured to measure a temperature of the memory array; and
    logic configured to calculate a negative bias temperature instability (NBTI) value associated with the memory array based on an NBTI model using the temperature and using fabrication data associated with the memory array, wherein the NBTI value corresponds to an estimated change in threshold voltage due to p-channel degradation, the logic further configured to set an operating voltage to be supplied to the memory array based on the calculated NBTI value.

15. The apparatus of claim 14, further comprising core logic that is powered by a core logic operating voltage.

16. The apparatus of claim 14, wherein the memory array is further configured to receive a standby voltage during a standby mode, wherein the standby voltage is calculated based on a measured standby temperature and based on the fabrication data.

17. The apparatus of claim 16, wherein a voltage provided to the memory array is regulated based on the operating voltage or the standby voltage.

18. The apparatus of claim 14, wherein the fabrication data characterizes a switching capability of at least one element of the memory array.

19. The apparatus of claim 14, wherein the fabrication data includes information related to the NBTI model of the memory array.

20. The apparatus of claim 14, further comprising:
    a first die, wherein the memory array and the sensor are located on the first die; and
    a second die, wherein the second die includes a second memory array and a second sensor configured to measure a temperature of the second memory array.

21. The apparatus of claim 20, wherein the logic is further configured to set a second operating voltage to be supplied to the second memory array based on the temperature of the second memory array and fabrication data associated with the second memory array, and wherein the second operating voltage is set independently of the operating voltage.

22. The apparatus of claim 14, wherein the memory array comprises fin field-effect transistor (FinFET) devices.

23. The apparatus of claim 14, further comprising a device selected from a group consisting of a communications device, a computer, a set top box, a music player, a video player, an entertainment unit, a navigation device, a personal digital assistant (PDA), and a fixed location data unit, into which the memory array is integrated.

24. An apparatus comprising:
    means for measuring a temperature of a sensor associated with a memory array;
    means for calculating a negative bias temperature instability (NBTI) value associated with the memory based on an NBTI model and using the temperature, wherein the NBTI value corresponds to an estimated change in threshold voltage due to p-channel degradation, the means for calculating configured to calculate an operating voltage based on the calculated NBTI value; and means for regulating a voltage based on the operating voltage.

25. The apparatus of claim 24 integrated in at least one semiconductor die.

26. The apparatus of claim 25, further comprising a device selected from a group consisting of a set top box, a music player, a video player, an entertainment unit, a navigation device, a communications device, a computer, a personal digital assistant (PDA), and a fixed location data unit, into which the means for calculating and the means for regulating are integrated.

27. A non-transitory computer-readable storage medium storing instructions executable by a computer to perform operations comprising:
calculating, at a voltage regulating device, a negative bias temperature instability (NBTI) value associated with a memory using a measured temperature of a memory array and based on an NBTI model, wherein the NBTI value corresponds to an estimated change in threshold voltage due to p-channel degradation;
determining, at the voltage regulating device, an operating voltage based on the calculated NBTI value; and
regulating, at the voltage regulating device, a voltage provided to the memory array based on the operating voltage.

28. The non-transitory computer-readable storage medium of claim 27, wherein the instructions are executable by a processor integrated in a device selected from a group consisting of a communications device, a computer, a set top box, a music player, a video player, an entertainment unit, a navigation device, a personal digital assistant (PDA), and a fixed location data unit.

29. A method comprising:
receiving design information comprising physical positioning information of a packaged semiconductor device on a circuit board, the packaged semiconductor device comprising:
a memory array;
a sensor configured to measure a temperature of the memory array; and
logic configured to calculate a negative bias temperature instability (NBTI) value associated with the memory array using the temperature and based on an NBTI model, wherein the NBTI value corresponds to an estimated change in threshold voltage due to p-channel degradation, the logic configured to set an operating voltage to be supplied to the memory array based on the calculated NBTI value; and
transforming the design information to generate a data file.

30. The method of claim 29, wherein the data file has a GERBER format.

31. The method of claim 29, wherein the data file has a GDSII format.

* * * * *